US00RE42292E

(19) United States
(12) Reissued Patent
Berezin et al.

(10) Patent Number: US RE42,292 E
(45) Date of Reissued Patent: Apr. 12, 2011

(54) PINNED PHOTODIODE PHOTODETECTOR WITH COMMON PIXEL TRANSISTORS AND BINNING CAPABILITY

(75) Inventors: Vladimir Berezin, La Crescenta, CA (US); Alexander I. Krymski, Pasadena, CA (US); Eric R. Fossum, Wolfeboro, NH (US)

(73) Assignee: Round Rock Research, LLC, Mt. Kisco, NY (US)

(21) Appl. No.: 12/413,626

(22) Filed: Mar. 30, 2009

Related U.S. Patent Documents

Reissue of:

(64) Patent No.: 6,794,214
Issued: Sep. 21, 2004
Appl. No.: 09/867,846
Filed: May 29, 2001

U.S. Applications:

(62) Division of application No. 11/524,495, filed on Sep. 21, 2006, now Pat. No. Re. 41,340, which is a continuation of application No. 09/378,565, filed on Aug. 19, 1999, now Pat. No. 6,239,456.

(60) Provisional application No. 60/097,135, filed on Aug. 19, 1998.

(51) Int. Cl.
*H01L 31/062* (2006.01)
*H01L 31/105* (2006.01)

(52) U.S. Cl. ..... 438/57; 438/59; 438/70; 438/73; 438/78; 257/232; 257/233; 257/292; 257/E27.132; 257/E27.134; 348/296; 348/302; 348/307; 372/50; 372/50.1; 372/50.12; 372/50.21

(58) Field of Classification Search ..... 438/57, 438/59, 60, 73; 257/232, 233, 291, 292; 348/296, 348/302, 307; 372/50, 50.1, 50.12, 50.21
See application file for complete search history.

(56) References Cited

U.S. PATENT DOCUMENTS 4,809,075 A 2/1989 Akimoto et al.
4,827,345 A 5/1989 Nakagawa et al.
5,043,568 A 8/1991 Tsuchiya et al.
5,099,694 A 3/1992 Sumio et al.
5,148,268 A * 9/1992 Tandon et al. ..... 348/280
5,172,249 A 12/1992 Hashimoto
5,179,565 A 1/1993 Tsuchiya et al.
5,262,871 A 11/1993 Wilder et al.
5,497,390 A 3/1996 Tanaka et al.
5,635,705 A 6/1997 Saunders (Continued)

FOREIGN PATENT DOCUMENTS

| | | |
|---|---|---|
| EP | 616464 | 9/1994 |
| EP | 707417 | 4/1996 |
| JP | 04-004681 | 1/1992 |
| JP | H04-004682 | 1/1992 |
| JP | 05-207376 | 8/1993 |
| JP | 2000-152086 | 5/2000 |
| JP | 2001-298177 | 10/2001 |

OTHER PUBLICATIONS

Bouffault et al., "High speed cameras using CCD image sensor and a new high speed image sensor for biological applications," SPIE vol. 2513, pp. 252–258 (May 30, 1995).

(Continued)

*Primary Examiner*—Dao H Nguyen
(74) *Attorney, Agent, or Firm*—Lerner, David, Littenberg, Krumholz & Mentlik, LLP

(57) ABSTRACT

[A lock in pinned photodiode photodetector includes a plurality of output ports which are sequentially enabled. Each time when the output port is enabled is considered to be a different bin of time. A specified pattern is sent, and the output bins are investigated to look for that pattern. The time when the pattern is received indicates the time of flight.] *A CMOS active pixel image sensor includes a plurality of pinned photodiode photodetectors that use a common output transistor. In one configuration, the charge from two or more pinned photodiodes may be binned together and applied to the gate of an output transistor.*

40 Claims, 4 Drawing Sheets

U.S. PATENT DOCUMENTS

| | | | | | |
|---|---|---|---|---|---|
| 5,691,486 | A | | 11/1997 | Behringer et al. | |
| 5,717,199 | A | | 2/1998 | Carbone et al. | |
| 5,739,562 | A | | 4/1998 | Ackland et al. | |
| 5,790,191 | A | | 8/1998 | Zhang | |
| 5,880,495 | A | | 3/1999 | Chen | |
| 5,898,168 | A | | 4/1999 | Gowda et al. | |
| 5,904,493 | A | | 5/1999 | Lee et al. | |
| 5,936,986 | A | | 8/1999 | Cantatore et al. | |
| 5,949,483 | A | | 9/1999 | Fossum et al. | |
| 5,955,753 | A | | 9/1999 | Takahashi | |
| 5,970,115 | A | | 10/1999 | Colbeth et al. | |
| 5,973,311 | A | | 10/1999 | Sauer et al. | |
| 5,986,510 | A | | 11/1999 | Graeve et al. | |
| 6,043,478 | A | * | 3/2000 | Wang | 250/208.1 |
| 6,084,229 | A | | 7/2000 | Pace et al. | |
| 6,100,551 | A | | 8/2000 | Lee et al. | |
| 6,107,655 | A | | 8/2000 | Guidash | |
| 6,127,697 | A | | 10/2000 | Guidash | |
| 6,160,281 | A | | 12/2000 | Guidash | |
| 6,233,013 | B1 | * | 5/2001 | Hosier et al. | 348/308 |
| 6,249,618 | B1 | | 6/2001 | Hou | |
| 6,252,217 | B1 | | 6/2001 | Pyyhtia et al. | |
| 6,297,070 | B1 | | 10/2001 | Lee et al. | |
| 6,377,304 | B1 | | 4/2002 | Saitoh | |
| 6,388,243 | B1 | | 5/2002 | Berezin et al. | |
| 6,512,546 | B1 | | 1/2003 | Decker et al. | |
| 6,519,371 | B1 | | 2/2003 | Pain et al. | |
| 6,614,479 | B1 | | 9/2003 | Fukusho et al. | |
| 6,657,665 | B1 | | 12/2003 | Guidash | |
| 6,693,670 | B1 | | 2/2004 | Stark | |
| 6,731,335 | B1 | | 5/2004 | Kim et al. | |
| 6,831,690 | B1 | | 12/2004 | John et al. | |
| 6,977,684 | B1 | | 12/2005 | Hashimoto et al. | |
| 2002/0180875 | A1 | | 12/2002 | Guidash | |
| 2005/0012836 | A1 | | 1/2005 | Guidash | |

OTHER PUBLICATIONS

Kemeny et al., "CMOS Active Pixel Sensor Array with Programmable Multiresolution Readout", IEEE (1997), pp. 127–131.

Ricquier et al., "The CIVIS Sensor: A Flexible Smart Imager with Programmable resolution," SPIE vol. 2172, pp. 2–10 (1994).

Zhou et al., "Frame–Transfer CMOS Active Pixel Sensor With Pixel Binning," IEEE Transactions on Electron Devices, vol. 44, No. 10, pp. p2–1–p2–4 (Oct. 1997).

* cited by examiner

PINNED PHOTODIODE PHOTODETECTOR WITH COMMON PIXEL TRANSISTORS AND BINNING CAPABILITY

Matter enclosed in heavy brackets [ ] appears in the original patent but forms no part of this reissue specification; matter printed in italics indicates the additions made by reissue.

CROSS REFERENCE TO RELATED APPLICATIONS

[This application] *Notice: More than one reissue application has been filed for the reissue of U.S. Pat. No. 6,794,214. The reissue applications are application Ser. No. 12/413,626 (the present application), which is a divisional reissue application of reissue application Ser. No. 11/524,495, which is a reissue of U.S. Pat. No. 6,794,214, issued on Sep. 21, 2004. U.S. Pat. No. 6,794,214* is a continuation of U.S. patent application Ser. No. 09/378,565, filed Aug. 19, 1999 now U.S. Pat. No. 6,239,456, which claims the benefit of the U.S. Provisional Application No. 60/097,135, filed on Aug. 19, 1998, which is incorporated herein by reference.

BACKGROUND

Certain applications require measuring aspects that are based on the speed of light.

For example, range finding can be carried out using optics. An optical signal is sent. The reflection therefrom is received. The time that it takes to receive the reflection of the optical signal gives an indication of the distance.

The so called lock-in technique uses an encoded temporal pattern as a signal reference. The device locks into the received signal to find the time of receipt. However, noise can mask the temporal pattern.

A lock in photodetector based on charged coupled devices or CCDs has been described in Miagawa and Kanada "CCD based range finding sensor" IEEE Transactions on Electronic Devices, volume 44 pages 1648–1652 1997.

CCDs are well known to have relatively large power consumption.

SUMMARY

The present application describes a special kind of lock in detector formed using CMOS technology. More specifically, a lock in detector is formed from a pinned photodiode. The photodiode is modified to enable faster operation.

It is advantageous to obtain as much readout as possible to maximize the signal to noise ratio. The pinned photodiode provides virtually complete charge transfer readout.

Fast separation of the photo-generated carriers is obtained by separating the diode into smaller sub-parts and summing the output values of the subparts to obtain an increased composite signal.

BRIEF DESCRIPTION OF THE DRAWINGS

These an other aspects will now be described in detail with reference to the accompanying drawings, wherein.

DESCRIPTION OF THE PREFERRED EMBODIMENT

The present application uses a special, multiple output port pinned photodiode as the lock in pixel element. The photodiode is preferably part of a CMOS active pixel image sensor, of the type described in U.S. Pat. No. 5,471,505. Hence, the system preferably includes in-pixel buffer transistors and selection transistors, in addition to the CMOS photodetector.

Figure 1:
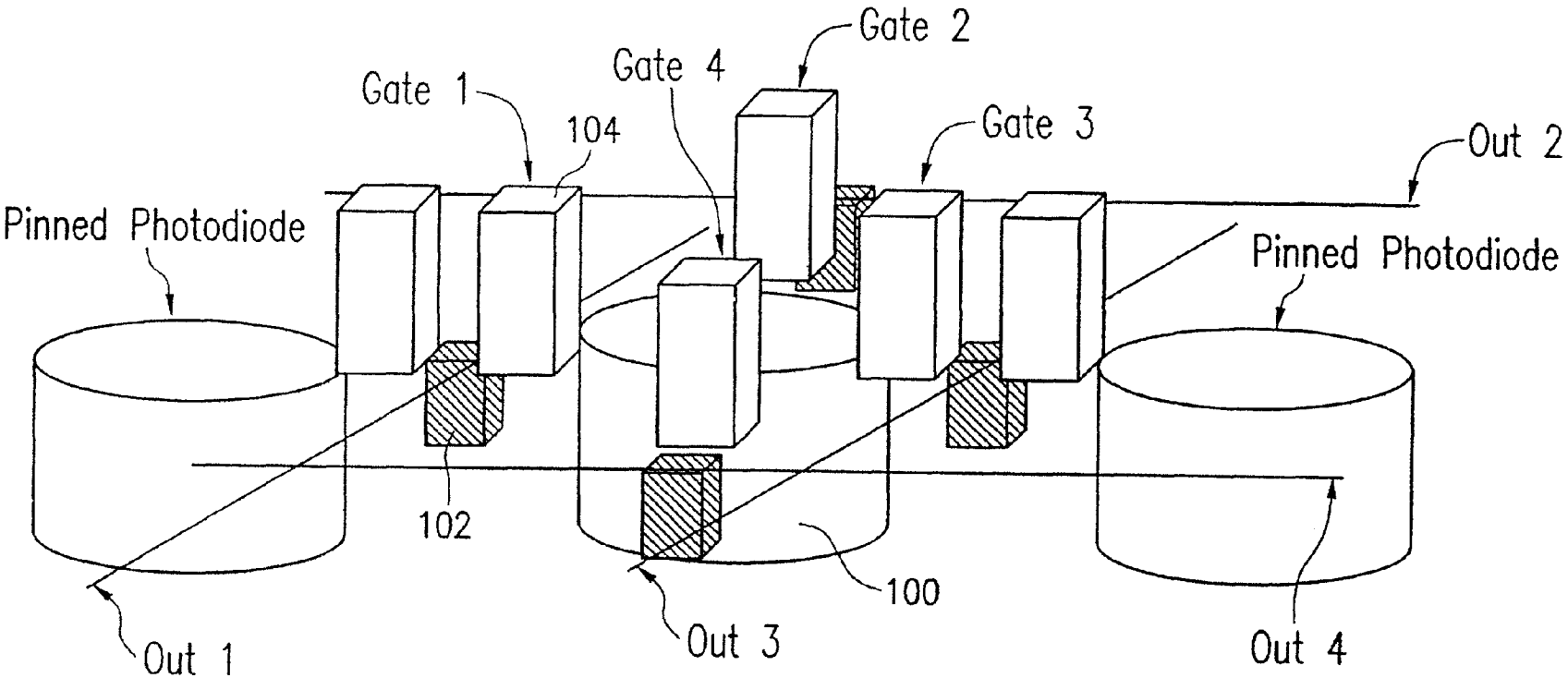
FIG. 1 shows a basic block diagram of the system.

FIG. 1 shows a pinned photodiode with four output ports, labeled as out1-out4. Each of the output ports is used to receive a reflection for a specified time duration. Each output becomes a "bin". The counting of the amount of information in the bins enables determination of the reflection time, and hence the range.

Pinned photodiodes are well known in the art and described in U.S. Pat. No. 5,904,493. A pinned photodiode is also known as a hole accumulation diode or HAD, or a virtual phase diode or VP diode. Advantages of these devices are well known in the art. They have small dark current due to suppression of surface generation. They have good quantum efficiency since there are few or no polysilicon gates over the photosensitive region. Pinned photodiodes can also be made into smaller pixels because they have fewer gates.

The basic structure of the pinned photodiode lock in pixel is shown in FIG. 1. Four switched integrators are formed respectively at four output ports. Each gate is enabled during a specified period. The different integrators integrate carriers accumulated during the different periods. The first integrator accumulates carriers between 0 and $\pi/2$, the second between $\pi/2$ and $\pi$, the third between $\pi$ and $3\pi/2$ and the fourth between $3\pi/2$ and $2\pi$time slots.

Assuming the light to be a cosine phase, then the phase shift of the detected light is given by $$\arctan[(L1-L3)/(L2-L4)],$$

where L1, L2, L3 and L4 are the amplititudes of the samples from the respective first, second, third and fourth integrators. These four phases are obtained from the four outputs of the photodiode.

The first pinned photodiode 100 is connected to an output drain 102 via gate 1, element 104. This receives the charge for the first bin. Similarly, gates 2, 3 and 4 are turned on to integrate/bin from the second, third and fourth periods.

It is important to obtain as much signal as possible from the photodiode. This can be done by using a large photodiode. However, it can take the electrons a relatively long time to escape from a large photodetector.

Figure 2:
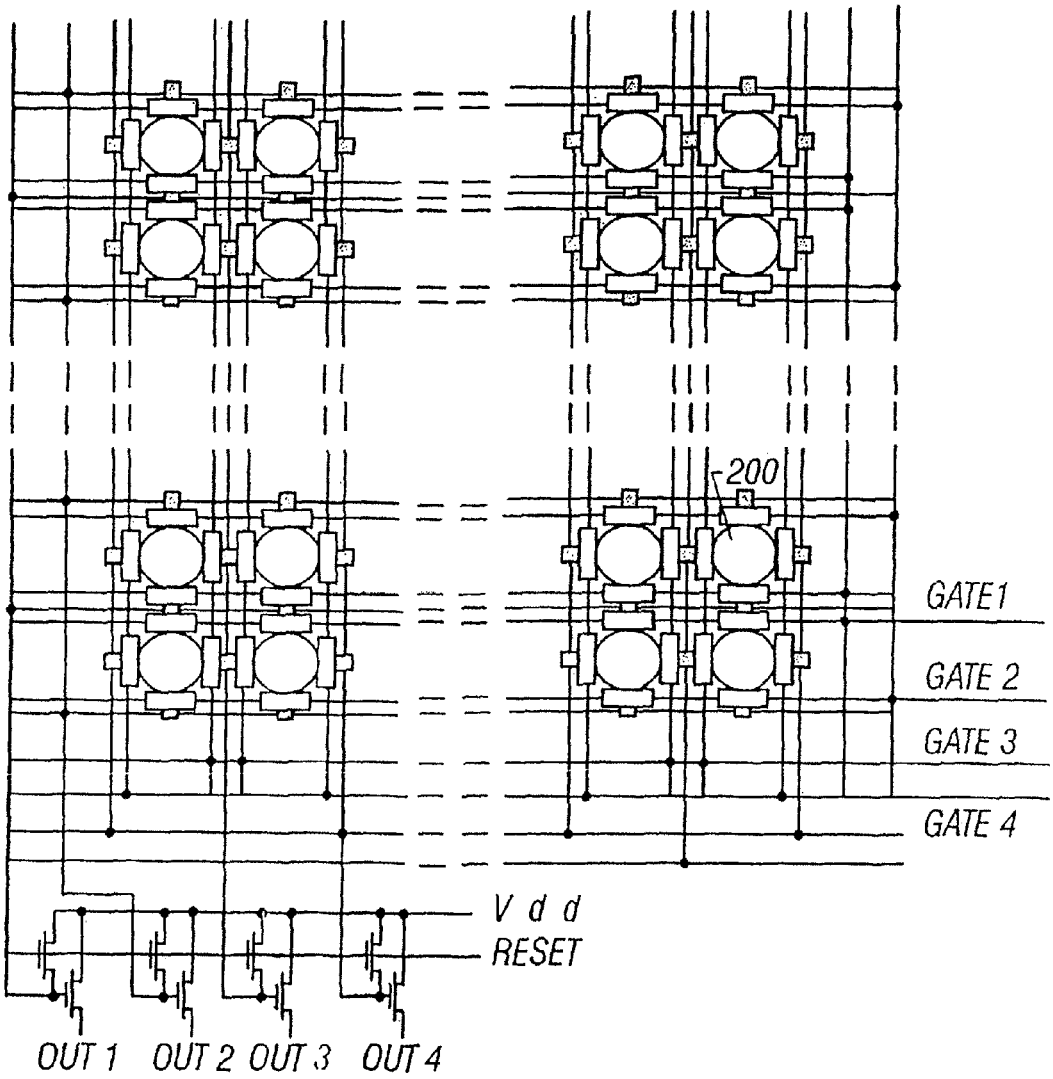
FIG. 2 shows a block diagram of the multiple photodiode parts.

The present system divides the one larger photodiode into a number of smaller diodes, each with multiple output ports. FIG. 2 shows the system.

A number of subpixels are formed. Each includes a number of pinned photodiodes 200, each with four ports. Each of the corresponding ports are connected together in a way that allows summing the outputs of the photodiodes. For example, all the gate 1 control lines are connected together as shown. The outputs from all the port 1s are also summed, and output as a simple composite output. Similarly, ports 2, 3 and 4's are all summed.

Figure 3:
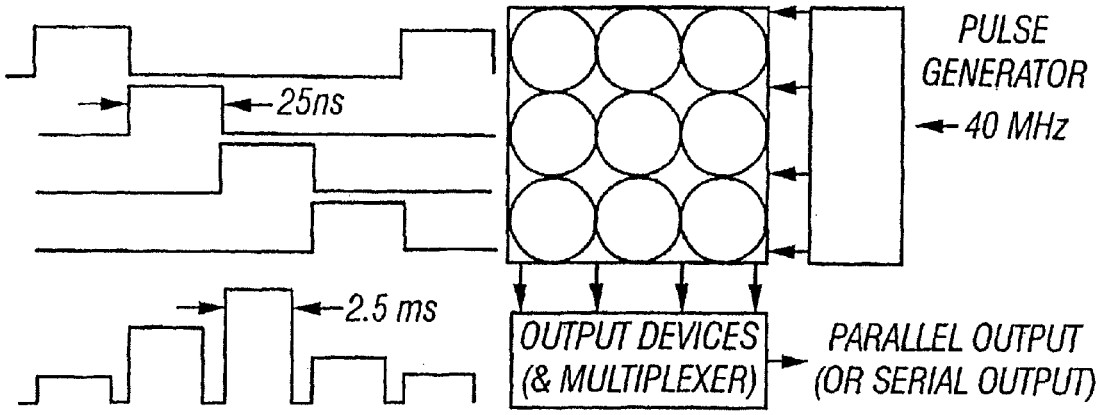
FIG. 3 shows a block diagram of the system as used in range finding.

FIG. 3 shows the circuit and driving waveforms for the system when used as a range finder. A pulse generator drives selection of the active output. Each time period is separately accumulated, and output. If a 40 MHZ pulse generator is used, 25 ns resolution can be obtained.

Figure 4A:
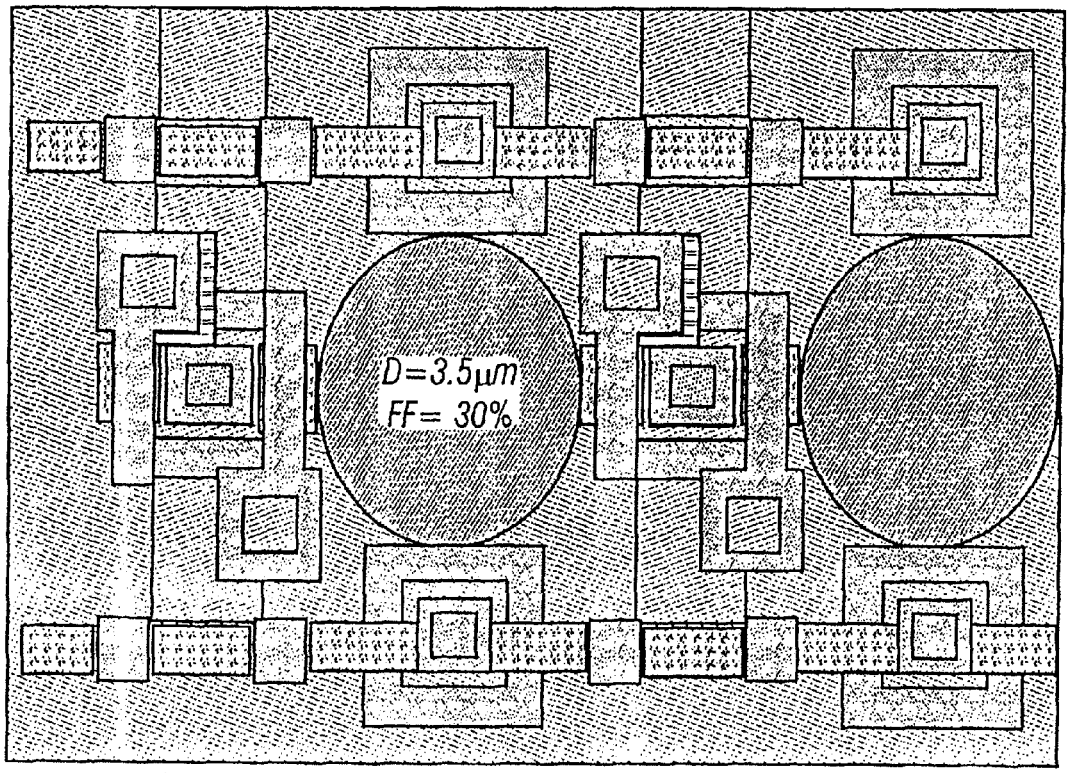
FIG. 4a and 4b show pixel layouts.
Figure 4B:
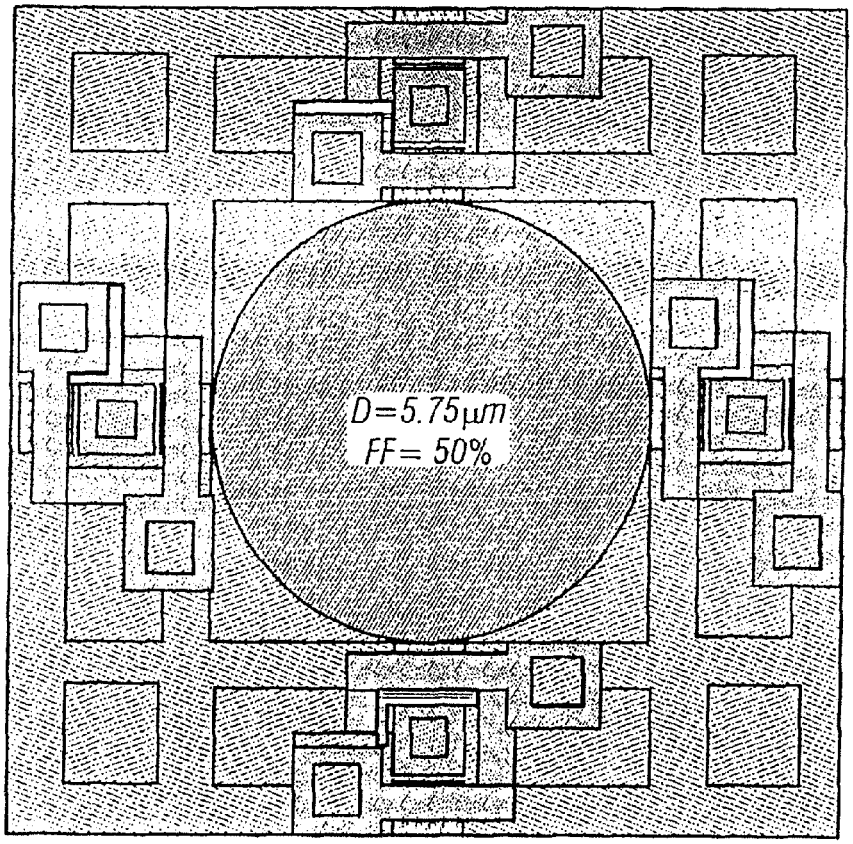

FIGS. 4A and 4B show representative pixel layouts. FIG. 4A shows a 6 by 6 square micron pixel layout while FIG. 4B shows an 8½ by 8½ micron pixel layout. In both Figures, four outputs are shown.

Figure 5:
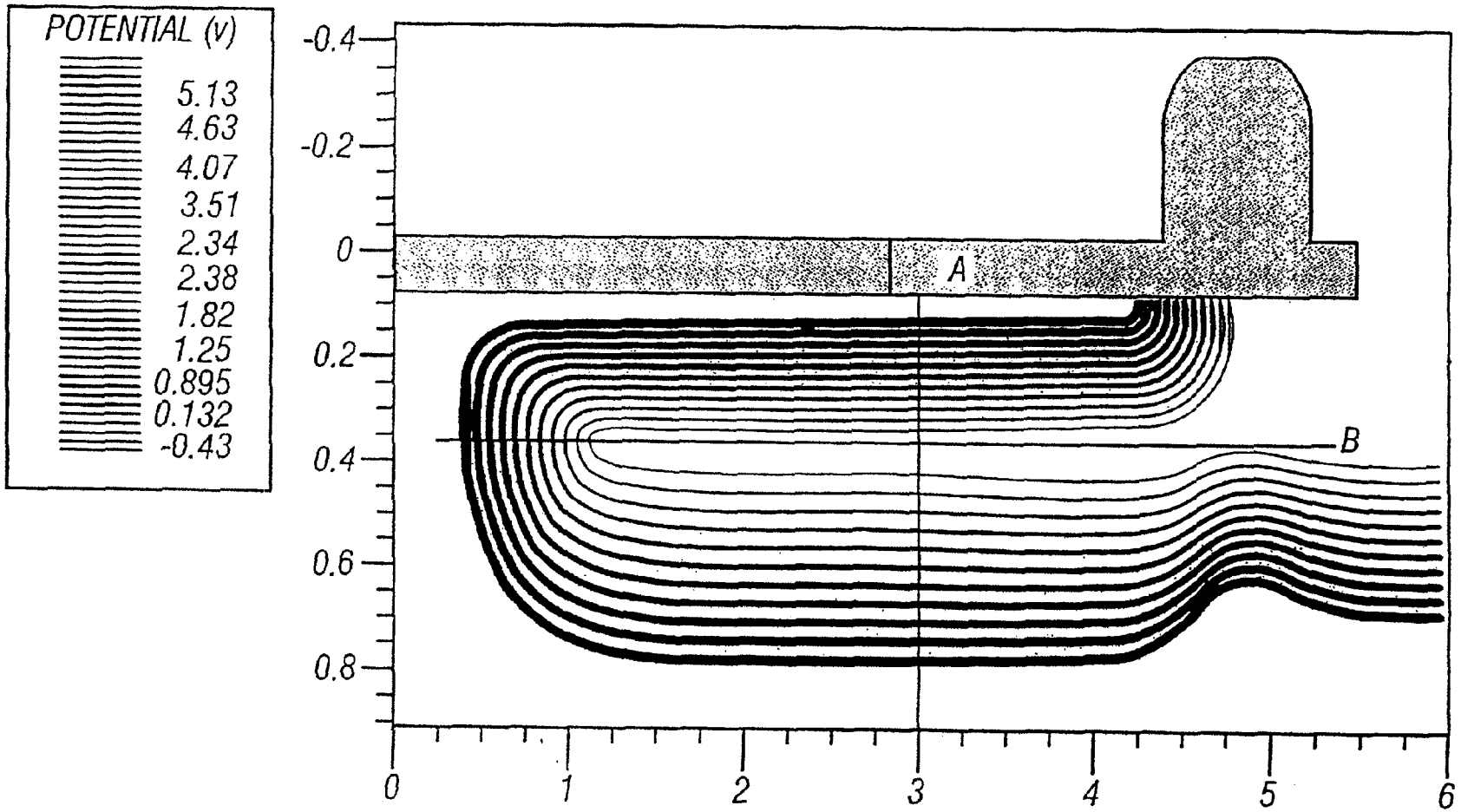
FIG. 5 shows a cross section of the pinned photodiode.

FIG. 5 shows a cross sectional potential diagram of an exemplary pinned photodiode.

Assuming the operation frequency of modulated light is 10 megahertz with a 25 nanosecond integration slot, the generator carrier has a time of flight within this limit. This resolution time constrains the size of the detector. In addition, the characteristic diffusion time in a semiconductor device is $L^2/D$, where D is the diffusion coefficient. This time originates from the continuity equation and the diffusion equation, and defines how soon the steady state will be established in the area of size L. Hence, for a 10 cm square per second electron diffusion coefficient, the characteristic size of the pinned photodiode could be less than 5 microns.

Other embodiments are also contemplated to exist within this disclosure. For example, other numbers of output ports, e.g. 2-8, are possible. While this application describes using a pinned photodiode, similar operations could be carried out with other CMOS photodetectors, e.g., photodiodes and photogates.

Such modifications are intended to be encompassed within the following claims.

What is claimed is:

[1. A method, comprising:

accumulating photocarriers in each of a plurality of photocarrier integrators and successively enabling each of said plurality of photocarrier integrators to connect to a common photodiode, each of said photocarrier integrators connecting to said common photodiode through a respective photodiode output port, said plurality of photocarrier integrators accumulating photocarriers generated by said photodiode during different time periods from one another.]

[2. A method as in claim 1, wherein said enabling comprises actuating a gate that is connected between each said photocarrier integrator and said photodiode.]

[3. A method as in claim 2, further comprising, after said enabling, detecting a number of carriers accumulated in said photodiode during at least two of said time periods by detecting the number of photocarriers accumulated in at least two said photocarrier integrators.]

[4. A method as an claim 2, wherein said photodiode is a pinned photodiode, and further comprising, after said enabling, detecting a number of carriers accumulated in said pinned photodiode during at least two of said time periods by decting the number of photocarriers accumulated in at least two said photocarrier integrators.]

[5. A method as in claim 1, wherein there are four of said photocarrier integrators, and said successively enabling comprises using a first photocarrier integrator to accumulate photocarrier between times 0 and $\pi/2$, a second photocarrier integrator to accumulate photocarriers between times $\pi/2$ and $\pi$; a third photocarrier integrator to accumulate photocarriers between times $\pi$ and $3\pi/2$, and a fourth photocarrier integrator to accumulate photocarriers between times $3\pi/2$ and $2\pi$.]

[6. A method as in claim 1, further comprising detecting a phase shift of light received by said photodiode by detecting accumulated charge in at least two photocarrier integrators.]

[7. A method, comprising:

generating photocarriers in a photodiode within a pixel during a plurality of time periods;

accumulating photocarriers in each of a plurality of photocarrier integrators within said pixel such that each photocarrier integrator accumulates photocarriers generated during a time period different from a time period in which other photocarrier integrators accumulate photocarriers; and sampling said photocarriers from said photocarrier integrators;

determining a range of an object using said sampled photocarriers.]

[8. A method as in claim 7, further comprising controlling each of said photocarrier integrators to be connected to said photodiode during said different time period.]

[9. A method as in claim 8, wherein said controlling comprises enabling a gate, said gate being connected to said photodiode and to one of said photocarrier integrators.]

[10. A method as in claim 9, wherein there are four of said photocarrier integrators, and wherein said enabling comprises successively enabling a first photocarrier integrator to accumulate photocarriers between times 0 and $\pi/2$, a second photocarrier integrator to accumulate photocarriers between times $\pi/2$ and $\pi$; a third photocarrier integrator to accumulate photocarriers between times $\pi$ and $3\pi/2$, and a fourth photocarrier integrator to accumulate photocarriers between times $3\pi/2$ and $2\pi$.]

[11. A method as in claim 7, wherein there are four of said photocarriers integrators, and said sampling comprises sampling photo carriers which are 90 degrees out of phase with one another.]

[12. A method, comprising:

sampling a plurality of different samples of light in a photodiode, each of said plurality of different samples being 90 degrees out of phase with one another; and successively gating photocarriers representing each of said different samples from said photodiode through a respective output port, each output port associated with a respective photocarrier integrator, such that each photocarrier integrator accumulates a different sample than other of said photocarrier integrators.]

[13. A method as in claim 12, further comprising detecting a phase shift using said samples of light.]

[14. A method as in claim 12, wherein there are four different gates connected to said photodiode each gating a different sample.]

[15. A method as in claim 12, wherein there are four photocarrier integrators, and wherein said act of gating comprises successively enabling a first photocarrier integrator to accumulate photocarriers between times 0 and $\pi/2$, a second photocarrier integrator to accumulate photocarriers between times $\pi/2$ and $\pi$; a third photocarrier integrator to accumulate photocarriers between times $\pi$ and $3\pi/2$, and a fourth photocarrier integrator to accumulate photocarriers between times $3\pi/2$ and $2\pi$.]

[16. A method of operating a range finding sensor, the method comprising;

providing a plurality of photodiodes, each photodiode having a first output port for switchably coupling each respective photodiode to a first photocarrier integrator in a same pixel as said photodiode and a second output port for switchably coupling each photodiode to a second photocarrier integrator in a same pixel as said photodiode;

generating first photocarriers in said photodiodes in response to light received during a first time period;

transferring said first photocarriers to respective first photocarrier integrators via said first output ports;

generating second photocarriers in said photodiodes in response to light received during a second time period; and transferring said second photocarriers to respective second photocarrier integrators via said second output ports.]

[17. The method of claim 16, further comprising outputting said first photocarriers from first photocarrier integrators and outputting said second photocarriers from second photocarrier integrators.]

[18. The method of claim 17, wherein the act of outputting said first photocarriers comprises summing outputs of all of said first photocarrier integrators, and wherein the act of outputting said second photocarriers comprises summing outputs of all of said second photocarrier integrators.]

[19. The method of claim 16, further comprising counting the amount of photocarriers in said first photocarriers integrator and counting the amount of said second photocarriers in said second photocarrier integrator.]

[20. The method of claim 19, further comprising determining a range of an object using the results of said acts of counting.]

[21. The method of claim 16, wherein said act of providing a plurality of photodiodes includes providing said plurality of photodiodes within a common pixel.]

[22. The method of claim 16, wherein said act of transferring said first photocarriers comprises transferring said first photocarriers to respective first output drains by operating first gates connected to said photodiodes and said first output drains, and wherein said act of transferring said second photocarriers comprises transferring said second photocarriers to respective second output drains by operating second gates connected to said photodiodes and said second output drains.]

[23. The method of claim 16, wherein each photodiode further has a third output port for switchably coupling each photodiode to a third photocarrier integrator in a same pixel as said photodiode and a fourth output port for switchably coupling each photodiode to a fourth photocarrier integrator in a same pixel as said photodiode, and further comprising:

generating third photocarriers in said photodiodes in response to light received during a third time period;

transferring said third photocarriers to respective third photocarrier integrators via said third output ports;

generating fourth photocarriers in said photodiodes in response to light received during a fourth time period; and transferring said fourth photocarriers to respective fourth photocarrier integrators via said fourth output ports.]

[24. The method of claim 23, further comprising outputting said first photocarriers from said first photocarrier integrators, outputting said second photocarriers from said second photocarrier integrators, outputting said third photocarriers from said third photocarrier integrators, and outputting said fourth photocarriers from said fourth photocarrier integrators.]

[25. The method of claim 24, wherein the act of outputting said first photocarriers comprises summing outputs of all of said first photocarrier integrators, wherein the act of outputting said second photocarriers comprises summing outputs of all of said second photocarrier integrators, wherein the act of outputting said third photocarriers comprises summing outputs of all of said third photocarrier integrators, and wherein the act of outputting said fourth photocarriers comprises summing outputs of all of said fourth photocarrier integrators.]

*26. A method comprising:*

*providing an array of pixels of a CMOS active pixel image sensor, the array comprising a plurality of rows of pinned photodiodes and a plurality of columns of pinned photodiodes, and including first, second, third, and fourth pinned photodiodes in first, second, third, and fourth different rows, respectively, of the plurality of rows;*

*providing an in-pixel buffer transistor comprising a gate and coupled between a supply voltage and an output node, wherein the buffer transistor is configured to control a transfer of charge between the supply voltage and the output node in accordance with a voltage applied to the gate;*

*providing a first transfer transistor coupled between the first pinned photodiode and the gate, wherein the first transfer transistor is configured to control a transfer of charge between the first pinned photodiode and the gate;*

*providing a second transfer transistor coupled between the second pinned photodiode and the gate, wherein the second transfer transistor is configured to control a transfer of charge between the second pinned photodiode and the gate;*

*providing a third transfer transistor coupled between a third pinned photodiode and the gate, wherein the third transfer transistor is configured to control a transfer of charge between the third pinned photodiode and the gate;*

*providing a fourth transfer transistor coupled between a fourth pinned photodiode and the gate, wherein the fourth transfer transistor is configured to control a transfer of charge between the fourth pinned photodiode and the gate; and*

*providing a reset transistor coupled to the gate, wherein when the reset transistor is enabled, charge is transferred to the gate.*

*27. The method of claim 26, further comprising enabling the first transfer transistor and the second transfer transistor during a same period of time to bin charge from both the first pinned photodiode and the second pinned photodiode on the gate.*

*28. The method of claim 26, further comprising enabling the first, second, third, and fourth transfer transistors during a same period of time to bin charge from the first, second, third and fourth pinned photodiodes on the gate.*

*29. The method of claim 26, further comprising providing an in-pixel selection transistor.*

*30. The method of claim 26, wherein the reset transistor is coupled between the gate and the supply voltage.*

*31. The method of claim 26, further comprising:*

*providing a first charge collection region in a semiconductor material adjacent to the first and second pinned photodiodes, wherein the first transfer transistor is configured to control a transfer of charge between the first pinned photodiode and the first charge collection region and the second transfer transistor is configured to control a transfer of charge between the second pinned photodiode and the first charge collection region;*

*providing a second charge collection region in the semiconductor material adjacent to the third and fourth pinned photodiodes, wherein the third transfer transistor is configured to control a transfer of charge between the third pinned photodiode and the second charge collection region and the fourth transfer transistor is configured to control a transfer of charge between the fourth pinned photodiode and the second charge collection region; and*

*providing an electrical interconnect above the semiconductor material to couple the first region and the second region to the gate.*

*32. The method of claim 26, wherein the first, second, third, and fourth pinned photodiodes are in a same column of the plurality of columns of pinned photodiodes.*

*33. A method comprising:*

*accumulating charge in a first pinned photodiode of a first pixel that occupies a first row of an array of pixels of a CMOS active pixel imager comprising in-pixel buffer transistors;*

*transferring charge from the first pinned photodiode directly to a first diffusion region via a first transistor;*

*accumulating charge in a second pinned photodiode of a second pixel that occupies a second row, below the first row, of the array;*

*transferring charge from the second pinned photodiode directly to the first diffusion region via a second transistor;*

*accumulating charge in a third pinned photodiode of a third pixel that occupies a third row, below the second row, of the array;*

*transferring charge from the third pinned photodiode directly to a second diffusion region, separate from the first diffusion region, via a third transistor;*

*accumulating charge in a fourth pinned photodiode of a fourth pixel that occupies a fourth row, below the third row, of the array;*

*transferring charge from the fourth pinned photodiode directly to the second diffusion region via a fourth transistor;*

*applying charge from the first diffusion region to a gate of a fifth transistor coupled between a supply voltage and an output; and*

*applying charge from the second diffusion region to the gate of the fifth transistor, wherein the fifth transistor is common to the first, second, third, and fourth pixels.*

*34. The method of claim 33, further comprising turning on the first transistor and the second transistor during a same period of time.*

*35. The method of claim 34, further comprising turning on the third transistor and the fourth transistor during a same period of time.*

*36. The method of claim 33, further comprising resetting the first and second diffusion regions via a single reset transistor.*

*37. The method of claim 36, wherein the CMOS active pixel image sensor further comprises in-pixel selection transistors.*

*38. The method of claim 33, wherein the CMOS active pixel image sensor further comprises in-pixel selection transistors.*

*39. The method of claim 33, wherein the first, second, third, and fourth pixels occupy a single column of the array.*

*40. A method comprising:*

*enabling a CMOS active pixel image sensor to be exposed to light, wherein first, second, third, and fourth pinned photodiodes disposed in first, second, third, and fourth adjacent rows of photodiodes, respectively, of the CMOS active pixel image sensor are configured to generate first, second, third, and fourth charges upon exposure to the light, respectively;*

*enabling the first charge to be transferred to a gate of an output transistor via a first transfer transistor between the first pinned photodiode and the gate;*

*enabling the second charge to be transferred to the gate via a second transfer transistor between the second pinned photodiode and the gate;*

*enabling the third charge to be transferred to the gate via a third transfer transistor between the third pinned photodiode and the gate; and*

*enabling the fourth charge to be transferred to the gate via a fourth transfer transistor between the fourth pinned photodiode and the gate.*

*41. The method of claim 40, wherein the enabling the first charge to be transferred and the enabling the second charge to be transferred occur during a same period of time.*

*42. The method of claim 40, wherein the enabling the first charge to be transferred, the enabling the second charge to be transferred, the enabling the third charge to be transferred, and the enabling the fourth charge to be transferred occur during a same period of time.*

*43. The method of claim 40, further comprising enabling the gate to be reset via a reset transistor.*

*44. The method of claim 40, further comprising enabling pixels of the CMOS active pixel image sensor to be buffered using in-pixel buffer transistors.*

*45. The method of claim 44, further comprising enabling pixels of the CMOS active pixel image sensor to be selected for readout using in-pixel selection transistors.*

*46. The method of claim 44, wherein the first and second transfer transistors share a common first source/drain region adjacent to gates of the first and second transfer transistors, the third and fourth transfer transistors share a common second source/drain region adjacent to gates of the third and fourth transfer transistors, and the common first source/drain region is coupled to the common second source/drain region via an electrical interconnect disposed above the first and second source/drain regions.*

*47. The method of claim 40, wherein the first, second, third, and fourth pinned photodiodes are disposed in a first column of photodiodes.*

*48. A method comprising:*

*providing a device containing a CMOS active pixel image sensor, the sensor comprising an array of pixels and a plurality of pinned photodiodes arranged in rows including at least first, second, third, and fourth separate rows of photodiodes, each pixel including at least one pinned photodiode, the device configured to expose the CMOS active pixel image sensor to light, in response to which each pinned photodiode of the plurality of pinned photodiodes is to generate charge;*

*providing a first circuit configured to operate a gate of a first n-channel transfer transistor coupled between a first pinned photodiode of the first row of the plurality of pinned photodiodes and a gate of an n-channel in-pixel buffer transistor, wherein the buffer transistor is coupled between a supply voltage and an output;*

*providing a second circuit configured to operate a gate of a second n-channel transfer transistor coupled between a second pinned photodiode of the second row of the plurality of pinned photodiodes and the gate of the buffer transistor;*

*providing a third circuit configured to operate a gate of a third n-channel transfer transistor coupled between a third pinned photodiode of the third row of the plurality of pinned photodiodes and the gate of the buffer transistor;*

*providing a fourth circuit configured to operate a gate of a fourth n-channel transfer transistor coupled between a fourth pinned photodiode of the fourth row of the plu-*

*rality of pinned photodiodes and the gate of the buffer transistor; and*

*providing a fifth circuit configured to operate a gate of an n-channel reset transistor coupled to the gate of the buffer transistor to reset a voltage on the gate of the buffer transistor.*

*49. The method of claim 48, wherein the first circuit and the second circuit are configured to operate the first transfer transistor and the second transfer transistor, respectively, in a manner that causes charge from the first pinned photodiode and the second pinned photodiode to be binned together on the gate of the buffer transistor.*

*50. The method of claim 48, wherein the first, second, third, and fourth circuits are configured to operate the first, second, third, and fourth transfer transistors, respectively, in a manner that causes charge from the first, second, third, and fourth pinned photodiodes to be binned together on the gate of the buffer transistor.*

*51. The method of claim 48, further comprising providing a plurality of in-pixel selection transistors.*

*52. The method of claim 48, wherein each pixel includes at least one buffer transistor.*

*53. The method of claim 48, wherein the reset transistor is coupled between the gate of the buffer transistor and the supply voltage.*

*54. The method of claim 48, further comprising:*

*providing a first charge collection region in a semiconductor material adjacent to the first and second pinned photodiodes, wherein the first transfer transistor is configured to control a transfer of charge between the first pinned photodiode and the first charge collection region and the second transfer transistor is configured to control a transfer of charge between the second pinned photodiode and the first charge collection region; and*

*providing a second charge collection region, separate from the first region, in the semiconductor material adjacent to the third and fourth pinned photodiodes, wherein the third transfer transistor is configured to control a transfer of charge between the third pinned photodiode and the second charge collection region and the fourth transfer transistor is configured to control a transfer of charge between the fourth pinned photodiode and the second charge collection region.*

*55. The method of claim 54, wherein the first charge collection region is a drain of both the first and second transfer transistors, and the second charge collection region is a drain of both the third and fourth transfer transistors.*

*56. The method of claim 55, further comprising providing an electrical interconnect above the semiconductor material to couple the first region and the second region to the gate.*

*57. The method of claim 48, wherein the first, second, third, and fourth pinned photodiodes are arranged in a single column of the plurality of pinned photodiodes.*

*58. A method comprising:*

*exposing a CMOS active pixel imager to light;*

*generating signals responsive to the light in an array of pixels of the imager using photodiodes and in-pixel buffer transistors, comprising the steps of:*

*activating a first transfer transistor to transfer charge from a first photodiode in a first row of the array to a gate of an in-pixel buffer transistor of the image sensor;*

*activating a second transfer transistor to transfer charge from a second photodiode in a second row of the array to the gate;*

*activating a third transfer transistor to transfer charge from a third photodiode in a third row of the array to the gate; and*

*activating a fourth transfer transistor to transfer charge from a fourth photodiode in a fourth row of the array to the gate.*

*59. The method of claim 58, wherein at least two of the steps of activating occur at a same time.*

*60. The method of claim 58, further comprising activating a reset transistor to reset the gate.*

*61. The method of claim 60, further comprising activating an in-pixel selection transistor to selectively read an output from the in-pixel buffer transistor.*

*62. The method of claim 61, wherein the activating the first and second transfer transistors transfers charge to a common drain of the first and second transfer transistors, and the activating the third and fourth transfer transistors transfers charge to a common drain of the third and fourth transfer transistors.*

*63. The method of claim 58, wherein the activating the first and second transfer transistors transfers charge to a common drain of the first and second transfer transistors, and the activating the third and fourth transfer transistors transfers charge to a common drain of the third and fourth transfer transistors.*

*64. The method of claim 63, wherein the first, second, third, and fourth photodiodes are disposed in the same column of the array.*

*65. The method of claim 58, wherein the first, second, third, and fourth photodiodes are disposed in the same column of the array.*

* * * * *

UNITED STATES PATENT AND TRADEMARK OFFICE

CERTIFICATE OF CORRECTION

PATENT NO. : RE42,292 E
APPLICATION NO. : 12/413626
DATED : April 12, 2011
INVENTOR(S) : Vladimir Berezin, Alexander I. Krymski and Eric R. Fossum It is certified that error appears in the above-identified patent and that said Letters Patent is hereby corrected as shown below:

Column 2, line 7, "U.S. Patent No. 5,471,505" should read --U.S. Patent No. 5,471,515--.

Signed and Sealed this
Tenth Day of April, 2012

David J. Kappos

David J. Kappos
*Director of the United States Patent and Trademark Office*